United States Patent
Ueoka

[11] Patent Number: 5,355,342
[45] Date of Patent: Oct. 11, 1994

[54] SEMICONDUCTOR MEMORY DEVICE HAVING MULTIPLE SELECTOR UNIT SIMULTANEOUSLY SELECTING MEMORY CELLS FROM MEMORY CELL BLOCKS IN DIAGNOSTIC MODE OF OPERATION

[75] Inventor: Junji Ueoka, Tokyo, Japan

[73] Assignee: NEC Corporation, Tokyo, Japan

[21] Appl. No.: 52,665

[22] Filed: Apr. 27, 1993

[30] Foreign Application Priority Data

Apr. 27, 1992 [JP] Japan .................. 4-107169

[51] Int. Cl.[5] .................. G11C 7/00; G11C 29/00
[52] U.S. Cl. .................. 365/201; 365/230.03; 371/21.1
[58] Field of Search .............. 365/201, 230.03, 230.06; 371/21.1

[56] References Cited

U.S. PATENT DOCUMENTS

| | | | |
|---|---|---|---|
| 4,464,750 | 8/1984 | Tatematsu | 365/201 X |
| 4,744,061 | 5/1988 | Takemae et al. | 365/201 |
| 4,821,238 | 4/1989 | Tatematsu | 365/201 |
| 4,873,669 | 10/1989 | Furutani et al. | 365/201 |
| 5,016,220 | 5/1991 | Yamagata | 365/201 |

FOREIGN PATENT DOCUMENTS

| | | | |
|---|---|---|---|
| 0239679 | 10/1988 | Japan | 365/201 |
| 2-12817 | 5/1990 | Japan . | |
| 4-756 | 1/1992 | Japan . | |

Primary Examiner—Eugene R. LaRoche
Assistant Examiner—Son Dinh
Attorney, Agent, or Firm—Sughrue, Mion, Zinn, Macpeak & Seas

[57] ABSTRACT

A semiconductor memory device is subjected to a dynamic bias test upon completion of a fabrication process for screening out a product with potential defects, and a block selecting unit incorporated in the semiconductor memory device is responsive to block address bits for allowing an external device to access data bits stored in one of the memory cell blocks, wherein the block selecting unit is further responsive to a test signal indicative of the dynamic bias test for allowing a diagnostic system to write test bits into or read out the test bits from all of the memory cell blocks, thereby quickly completing the dynamic bias test.

3 Claims, 5 Drawing Sheets

SEMICONDUCTOR MEMORY DEVICE HAVING MULTIPLE SELECTOR UNIT SIMULTANEOUSLY SELECTING MEMORY CELLS FROM MEMORY CELL BLOCKS IN DIAGNOSTIC MODE OF OPERATION

FIELD OF THE INVENTION

This invention relates to a semiconductor memory device and, more particularly, to a semiconductor memory device having a plurality of memory cell sub-arrays.

DESCRIPTION OF THE RELATED ART

A typical example of the semiconductor memory device is illustrated in FIG. 1 of the drawings, and comprises a memory cell array 1 broken down into four memory cell blocks 1a, 1b, 1c and 1d. The four memory cell blocks 1a to 1d are respectively assigned block addresses, and block selecting signals SCS1, SCS2, SCS3 and SCS4 select one of the memory cell blocks 1a to 1d. The block selecting signals SCS1 to SCS4 are produced from block address bits. Namely, the block address bits are supplied from the outside to a block selecting unit 2, and decoded signals SS1, SS2, SS3 and SS4 are respectively distributed to block controllers 3a, 3b, 3d and 3d, respectively. The decoded signals SS1 to SS4 selects one of the block controllers 3a to 3d, and the selected block controller shifts the block selecting signal to active level.

Each of the memory cell blocks 1a to 1d is fabricated from a plurality of memory cell groups arranged in rows and columns, and row addresses and column addresses are respectively assigned to the rows of memory cell groups and the columns of memory cell groups. For this reason, each of the memory cell groups is accessible with row address bits indicative of a row address and column address bits indicative of a column address, and the memory cell blocks 1a to 1d are associated with respective row selecting units 4a, 4b, 4c and 4d and with respective column selecting units 5a, 5b, 5c and 5d. The row selecting units 4a to 4d are enabled with the block selecting signals SCS1 to SCS4, and one of the row selecting units 4a to 4d becomes responsive to the row address bits for selecting one of the rows of memory cell groups from the selected memory cell block. The column selecting units 5a to 5d are responsive to column address bits, and select the columns of memory cell groups from the respective memory cell blocks 1a to 1d.

Four sense amplifier units 6a, 6b, 6c and 6d are respectively associated with the column selecting units 5a to 5d, and are enabled with the block selecting signals SCS1 to SCS4. One of the sense amplifier units 6a to 6d enabled with the block selecting signals SCS1 to SCS4 rapidly develops differential voltages indicative of data bits written into or read out from a memory cell group, and the differential voltages are supplied from a plurality pairs of data bus lines DB11 and DB12 to DBn1 to DBn2 in a write-in cycle and from the associated column selecting unit in a read-out cycle. The plurality pairs of data bus lines DB11 and DB12 to DBn1 and DBn2 are coupled with an input and output unit 7, and the input and output unit 7 in turn is coupled with a plurality of input/output pins IO1 to IOn.

One of the reasons why the memory cell array 1 is broken down into the memory cell blocks 1a to 1d is reduction in parasitic capacitance coupled with each word line and each bit line. If the parasitic capacitance is decreased, the write-in cycle and the read-out cycle are accelerated, and electric power consumption is decreased. Therefore, the number of memory blocks is increased together with the memory capacity of the semiconductor memory device.

The semiconductor memory device thus arranged selectively enters a write-in mode and a read-out mode of operation. While the semiconductor memory device remains in the write-in mode with a write enable signal, data bits are written into any one of the memory cell groups of the memory cell array 1. Namely, the block address bits cause one of the block controllers 3a to 3d to shift one of the block selecting signals SCS1 to SCS4 to the active level, and the active block selecting signal enables one of the row selecting units 4a to 4d and one of the sense amplifier units 6a to 6d. The row selecting unit enabled with the block selecting signal selects one of the rows of memory cell groups from the associated memory cell block, and the associated column selecting unit couples the sense amplifier unit with the memory cell group assigned the column address indicated by the column address bits. Input data bits are supplied from the input and output data pins IO1 to IOn to the input and output unit 7, and the input and output unit 7 produces differential voltages indicative of the input data bits. The plurality pairs of data bus lines DB11 and DB12 to DBn1 and DBn2 propagate the differential voltages to the sense amplifier unit enabled with the block selecting signal, and the sense amplifier unit cause the input data bits to be written into the selected memory cell group.

If, on the other hand, the semiconductor memory device enters the read out mode, the block selecting unit 2 and one of the row selecting units 4a to 4d allow data bits to reach the associated column selecting unit. The column selecting unit is responsive to the column address bits, and transfers the data bits read out from the memory cell group assigned the row address indicated by the row address bits and the column address indicated by the column address bits to the sense amplifier circuit enabled with the block selecting signal. The read-out data bits are supplied to the sense amplifier unit in the form of differential voltages, and are rapidly developed. The differential voltages thus developed are propagated through the plurality pairs of data bus lines DB11 and DB12 to DBn1 and DBn2 to the input and output unit 7, and are supplied through the input and output data pins IO1 to IOn to a destination.

A semiconductor device manufacturer is usually expected to guarantee the products, and the semiconductor memory device is diagnosed by the semiconductor device manufacturer before delivery from the manufacturing facility. One of the test operations in the diagnosis is known as a dynamic bias test, and test bits are repeatedly written into and read out from the memory cell array 1 under application of the maximum rated voltage at 7 volts to 8 volts to the internal power supply line in high temperature atmosphere at around 125 degrees in centigrade for several hours to tens hours. If a semiconductor memory device contains defective memory cells, the test bits are changed between the write-in cycle and the read-out cycle, and the semiconductor memory device is screened out as a defective product.

The dynamic bias test guarantees the reliability of the semiconductor memory device, and is indispensable. However, since the test bits are written into and read out from the memory cell array 1 through the same sequences as the standard write-in mode and the standard read-out mode of operation, the dynamic bias test is time-consuming, and is prolonged together with the memory cell capacity. Time period for the write-in operation or the read-out operation is dominated by the diagnostic system, and the diagnostic system can repeat the write-in operation and the read-out operation inversely proportional to the number of the memory cell groups incorporated in each memory cell block and the number of the memory cell blocks. In other words, ratio of the dynamic stress to the static stress is inversely proportional to the memory capacity. On the other hand, a potential defect is actualized through the static stress as well as the dynamic stress, and the actualization is proportional to the time period of the static stress and the number of applications of the dynamic stress. However, the applications of dynamic stress dominate the actualization. For this reason, if the memory capacity of the semiconductor memory device is k times increased, the dynamic bias test consumes time period k times longer than the previous time period. The diagnostic system hardly accelerates the bias test, and the prolonged dynamic bias test decreases the throughput of the diagnostic system.

SUMMARY OF THE INVENTION

It is therefore an important object of the present invention to provide a semiconductor memory device which quickly completes a dynamic bias test regardless of the number of memory cell blocks.

To accomplish the object, the present invention proposes to enable a plurality of memory cell blocks to become responsive to row and column address bits in a dynamic bias test.

In accordance with the present invention, there is provided a semiconductor memory device selectively entering standard modes and a diagnostic mode of operation, comprising: a) a plurality of memory cell blocks each having a plurality of memory locations arranged in rows and columns, block addresses being assigned to the plurality of memory cell blocks, row addresses being respectively assigned to the rows of memory locations, column addresses being respectively assigned to the columns of memory locations; b) a block selecting unit responsive to block address bits indicative of a block address assigned to one of the plurality of memory cell blocks for producing a block selecting signal indicative of the aforesaid one of the plurality of memory cell blocks in the standard modes of operation, the block selecting unit further responsive to a test signal indicative of the diagnostic mode for producing a block selecting signal indicative of the plurality of memory cell blocks regardless of the block address bits in the diagnostic mode; c) a plurality of row selecting units respectively associated with the plurality of memory cell blocks, and enabled with the block selecting signal, one of the plurality of row selecting units enabled with the block selecting signal being responsive to row address bits indicative of a row address assigned to one of the rows of memory locations in the associated memory cell block in the standard modes, all of the plurality of row selecting units being responsive to the row address bits for selecting the rows of memory locations from the associated memory cell blocks, respectively; d) a plurality of column selecting units respectively associated with the plurality of memory cell blocks, and each responsive to column address bits indicative of a column address assigned to one of the columns of memory locations in the associated memory cell block; and e) a data distributing means coupled between a data port and the plurality of column selecting means, and operative to provide a data propagation path between the data port and one of the plurality of column selecting units associated with the memory cell block indicated by the block selecting signal in the standard modes, the data distributing means being further operative to provide data propagation paths between the data port and the plurality of memory cell blocks in the diagnostic mode.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
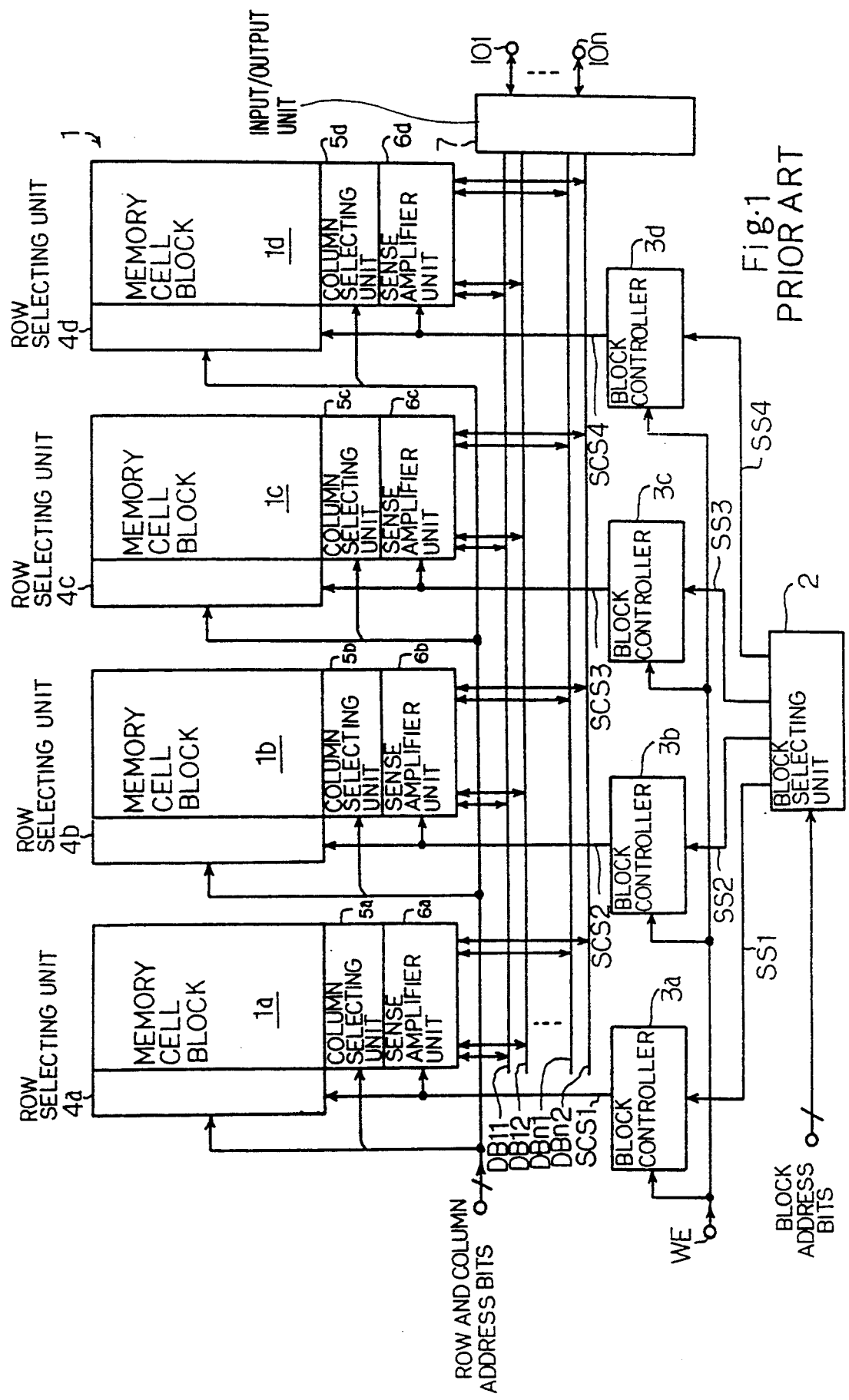
FIG. 1 is a block diagram showing the circuit arrangement of the prior art semiconductor memory device.
Figure 2:
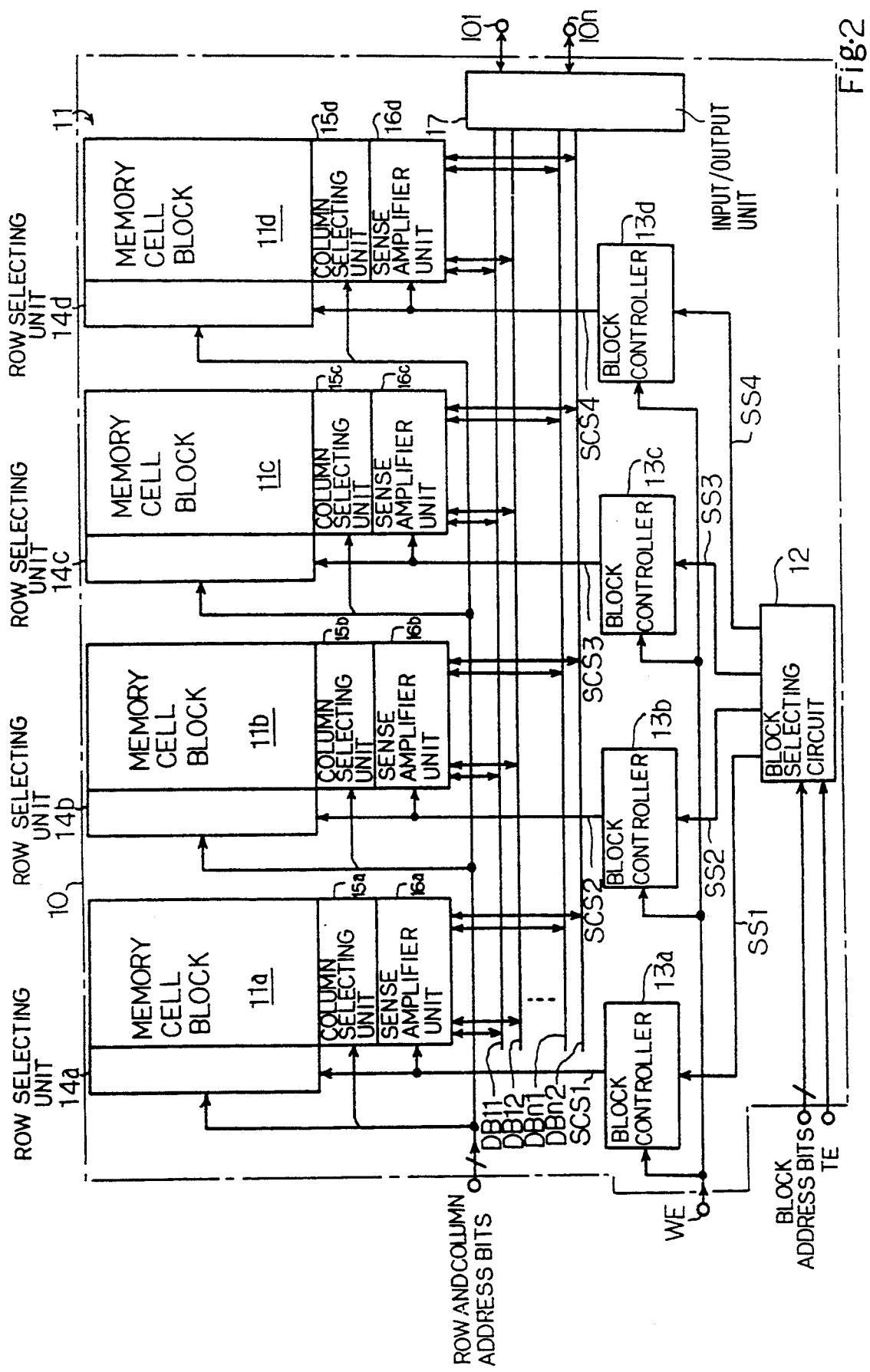
FIG. 2 is a block diagram showing the circuit arrangement of a semiconductor memory device according to the present invention.

Referring to FIG. 2 of the drawings, a semiconductor memory device is fabricated on a single semiconductor chip 10, and selectively enters at least a read-out mode, a write-in mode and a diagnostic mode of operation. In this instance, the read-out mode and the write-in mode are standard modes of operation. The semiconductor memory device comprises a memory cell array 11 broken down into four memory cell blocks 11a, 11b, 11c and 11d, and the four memory cell blocks 11a to 11d are respectively assigned block addresses. Block selecting signals SCS1, SCS2, SCS3 and SCS4 are respectively associated with the four memory cell blocks 11a to 11d, and select one of the memory cell blocks 11a to 11d on the basis of block address bits in the standard modes of operation. Namely, while the semiconductor memory device remains in the standard modes of operation, the block address bits are supplied from the outside to a block selecting circuit 12, and decoded signals SS1, SS2, SS3 and SS4 are respectively distributed to block controllers 13a, 13b, 13d and 13d, respectively. The decoded signals SS1 to SS4 selects one of the block controllers 13a to 13d, and the selected block controller shifts the block selecting signal to active level. However, if a test signal TE indicative of a dynamic bias test is applied to the block selecting circuit 12, the block selecting circuit 12 shifts all of the decoded signals SS1 to SS4 to active level, and, accordingly, all of the block controllers 13a to 13d produces the block selecting signals SCS1 to SCS4 of the active level. In this instance, the block selecting circuit 12 and the block controllers 13a to 13d form in combination a block selecting unit.

Figure 3:
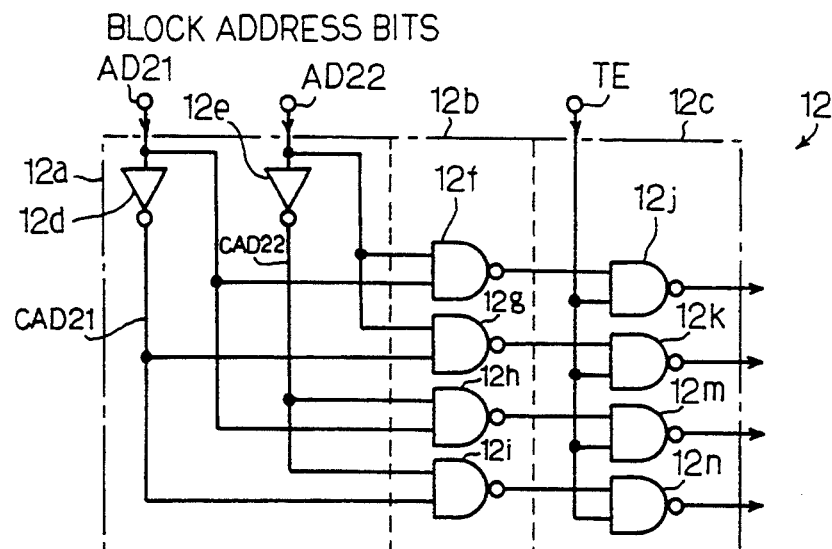
FIG. 3 is a logic diagram showing the arrangement of a block selecting unit incorporated in the semiconductor memory device shown in FIG. 2.

Turning to FIG. 3 of the drawings, the block selecting circuit 12 comprises a predecoder 12a for producing complementary block address bits CAD21 and CAD22, a decoder 12b responsive to the block address bits and the complementary block address bits and a multiple selector 12c operative to transfer the decoded signals of the decoder 12b or multiply selects the memory cell blocks 11a to 11d.

The predecoder 12a is implemented by two inverters 12d and 12e, and the inverters 12d and 12e produce the complementary block address bits CAD21 and CAD22, respectively.

The decoder 12b comprises four two-input NAND gates 12f, 12g, 12h and 12i, and the block address bits AD21 and AD22 and the complementary block address bits CAD21 and CAD22 are selectively supplied to the two-input NAND gates 12f to 12i. Therefore, one of the NAND gates 12f to 12i yields the decoded signal of logic "0" level corresponding to the low voltage level, and the other NAND gates cause the output nodes thereof to be in logic "1" level corresponding to the high voltage level.

The multiple selector 12c comprises four two-input NAND gates 12j, 12k, 12m and 12n, and the output nodes of the NAND gates 12f to 12i are respectively coupled with the NAND gates 12j top 12n. The test signal TE is distributed to the other input node of each of the NAND gates 12j to 12n, and the test signal TE goes down to active logic "0" level in the diagnostic mode. However, while the semiconductor memory device remains in the standard modes, the test signal TE remains in inactive logic "1" level.

Figure 4:
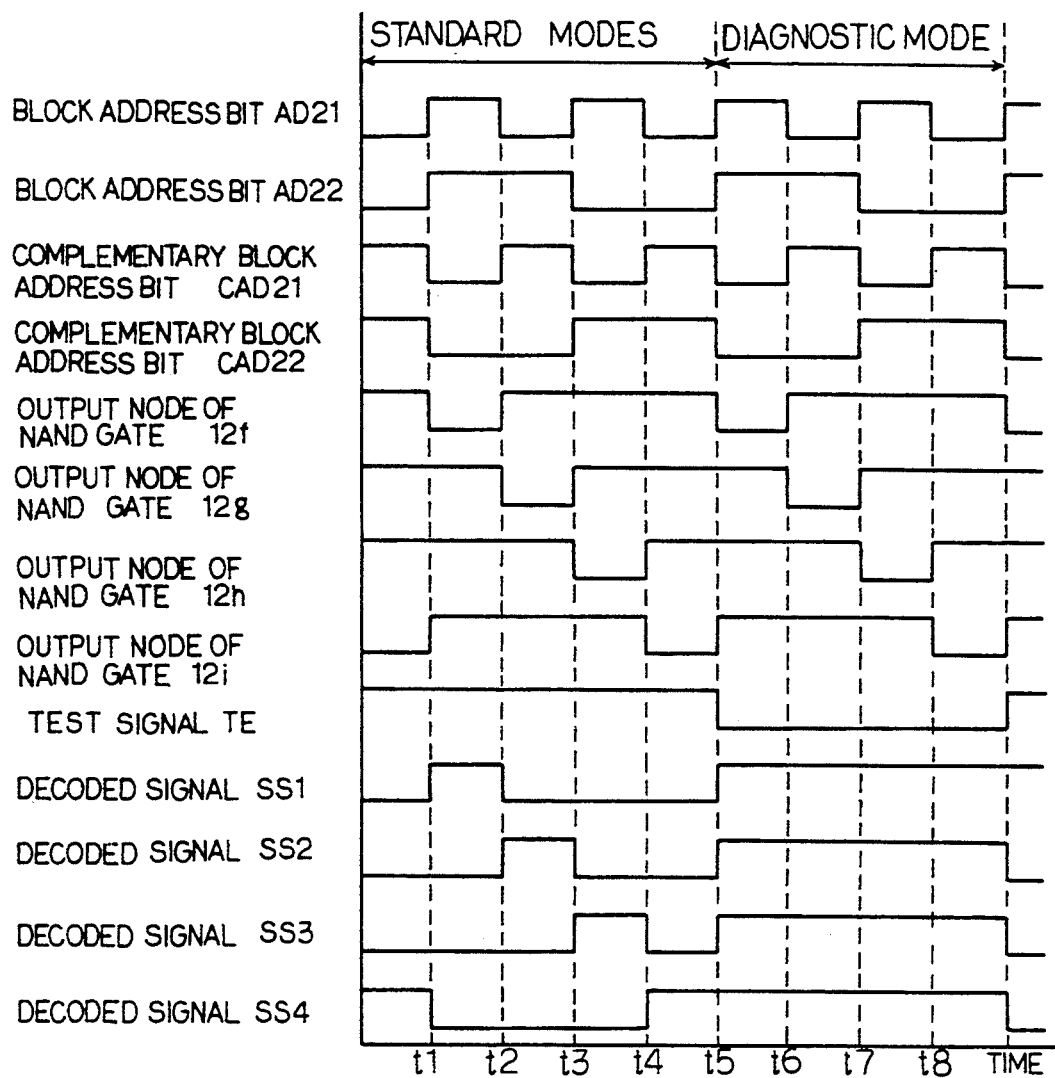
FIG. 4 is a diagram showing the circuit behavior of the block selecting unit.

The block selecting circuit 12 thus arranged behaves as follows. Assuming now that the block address is sequentially changed at times t1, t2, t3 and t4 in the absence of the test signal TE of the active logic "0" level as shown in FIG. 4, the output nodes of NAND gates 12f to 12i sequentially go down to logic "0" level, and, accordingly, the decoded signals SS1 to SS4 sequentially go up to the active high voltage level at times t1, t2, t3 and t4. As a result, the block controllers 13a to 13d sequentially shifts the block selecting signals SCS1 to SCS4 in synchronism with the decoded signals SS1 to SS4, and the memory cell blocks 11a to 11d becomes accessible at time t1, t2, t3 and t4.

However, if the test signal TE goes down to the active logic "0" level, the NAND gates 12j to 12n fix the decoded signals SS1 to SS4 to the active logic "1" level regardless of change of the block address bits AD21 and AD22 at times t6, t7 and t8, and the block controllers 13a to 13d make all of the memory cell blocks 11a to 11d accessible.

Turning back to FIG. 2, each of the memory cell blocks 11a to 11d is fabricated from a plurality of memory cell groups arranged in rows and columns, and row addresses and column addresses are respectively assigned to the rows of memory cell groups and the columns of memory cell groups. For this reason, each of the memory cell groups is accessible with row address bits indicative of a row address and column address bits indicative of a column address. In this instance, each of the memory cell groups provides a memory location. The memory cell blocks 11a to 11d are associated with respective row selecting units 14a, 14b, 14c and 14d and with respective column selecting units 15a, 15b, 15c and 15d. The row selecting units 14a to 14d are enabled with the block selecting signals SCS1 to SCS4, and one of the row selecting units 14a to 14d becomes responsive to the row address bits in the standard modes for selecting one of the rows of memory cell groups from the selected memory cell block. However, all of the row selecting units 14a to 14d become responsive to the row address bits in the diagnostic mode, because the block controllers 13a to 13d shift all of the block selecting signals SCS1 to SCS4 to the active level.

The column selecting units 15a to 15d are responsive to column address bits, and select the columns of memory cell groups from the respective memory cell blocks 11a to 11d. Therefore, a memory cell group is selected from the selected memory cell block by means of one of the row selecting units 14a to 14d enabled with the block selecting signal as well as the associated column selecting unit in the standard modes. However, four memory cell groups are selected from the respective memory cell blocks 11a to 11d by means of all the row selecting units 14a to 14d as well as the associated column selecting units 15a to 15d.

Four sense amplifier units 16a, 16b, 16c and 16d are respectively associated with the column selecting units 15a to 15d, and are selectively enabled with the block selecting signals SCS1 to SCS4 in the standard modes. However, all of the sense amplifier circuits 16a to 16d are enabled in the diagnostic mode. One of the sense amplifier units 16a to 16d selectively enabled with the block selecting signals SCS1 to SCS4 rapidly develops differential voltages indicative of data bits written into or read out from a memory cell group, and the differential voltages are transferred between one of the sense amplifier units 16a to 16d and a plurality pairs of data bus lines DB11 and DB12 to DBn1 to DBn2 in the standard modes. On the other hand, test bits are simultaneously distributed from the plurality pairs of data bus lines DB11 and DB12 to DBn1 and DBn2 to all of the sense amplifier units 16a to 16d in the diagnostic mode, and the test bits are read out from the sense amplifier units 16a to 16d to the plurality pairs of data bus lines DB11 and DB12 to DBn1 and DBn2. Although the test bits read out from the respective memory cell blocks 11a to 11d come into collision on each pair of data bus lines, the dynamic stress is effectively applied to the memory cell groups. However, comparators may be coupled between the sense amplifier units 16a to 16d and the plurality pairs of data bus lines DB11 and DB12 to DBn1 and DBn2, and the output data signal on a pair of data bus lines DB11 and DB12 or DBn1 and DBn2 is indicative of the consistency between the test bits or the inconsistency. Moreover, the test bits concurrently read out from the memory cell blocks 11a to 11d are sequentially transferred from the sense amplifier units 16a to 16d to the plurality pairs of data bus lines DB11 and DB12 to DBn1 and DBn2.

The plurality pairs of data bus lines DB11 and DB12 to DBn1 and DBn2 are coupled with an input and output unit 17, and the input and output unit 7 in turn is coupled with a plurality of input/output pins IO1 to IOn. In this instance, the sense amplifier units 16a to 16d, the plurality pairs of data bus lines DB11 and DB12 to DBn1 and DBn2 and the input/output unit 17 as a whole constitute a data distributing means.

The semiconductor memory device thus arranged selectively enters the diagnostic mode, the write-in mode and the read-out mode of operation. Upon completion of a fabrication process, the semiconductor memory device is subjected to various test operation to see whether or not any defect is incorporated therein. While the test signal TE is applied, the block selecting circuit 12 shifts all of the decoded signals SS12 to SS4 to the active logic "1" level, and all of the block controllers 13a to 13d produce the block selecting signals SCS1 to SCS4 of the active level. Then, all of the row selecting units 14a to 14d become responsive to the row address bits, and all of the sense amplifier circuits 16a to 16d are activated. A diagnostic system supplies test bits to the input and output data pins IO1 to IOn, and the input and output unit 17 produces differential voltages from the test bits. The differential voltages are supplied through the plurality pairs of data bus lines DB11 and DB12 to DBn1 and DBn2 to the sense amplifier units 16a to 16d. The row selecting units 14a to 14d and the column selecting units 15a to 15d selects four memory cell groups from the respective memory cell blocks 11a to 11d, and the test bits are concurrently written into the four memory cell groups. After the write-in of the test bits, the diagnostic system reads out the test bits from the four memory cell groups, and repeats the write-in and the read-out for predetermined time period so as to repeatedly apply the dynamic stress. Finally, the test signal TE is changed to the inactive level, and the test bits are sequentially read out to see whether or not inconsistency takes place. If all of the test bits are consistent with one another, the diagnostic system determines that the selected memory cell groups are excellent. However, if not, a potential defect is actualized, and the diagnostic system diagnoses that the semiconductor memory device is defective. Thus, the diagnostic system screens out the defective products.

While the semiconductor memory device remains in the write-in mode with a write enable signal WE, data bits are written into any one of the memory cell groups of the memory cell array 11. Namely, the block address bits AD21 and AD22 cause the block selecting circuit 12 to shift one of the decoded signals SS1 to SS4 to the active level, and, accordingly, one of the block controllers 13a to 13d produces the block selecting signal of the active level. The active block selecting signal enables one of the row selecting units 14a to 14d and one of the sense amplifier units 16a to 16d. The row selecting unit enabled with the block selecting signal selects one of the rows of memory cell groups from the associated memory cell block, and the associated column selecting unit couples the sense amplifier unit with the memory cell group assigned the column address indicated by the column address bits. Input data bits are supplied from the input and output data pins IO1 to IOn to the input and output unit 17, and the input and output unit 17 produces differential voltages indicative of the input data bits. The plurality pairs of data bus lines DB11 and DB12 to DBn1 and DBn2 propagate the differential voltages to the sense amplifier unit enabled with the block selecting signal, and the sense amplifier unit cause the input data bits to be written into the selected memory cell group.

If, on the other hand, the semiconductor memory device enters the read out mode, the block selecting circuit 12, one of the block controllers 13a to 13d and one of the row selecting units 4a to 4d allow data bits to reach the associated column selecting unit. The column selecting unit is responsive to the column address bits, and transfers the data bits read out from the memory cell group assigned the row address indicated by the row address bits and the column address indicated by the column address bits to the sense amplifier circuit enabled with the block selecting signal. The read-out data bits are supplied to the sense amplifier unit in the form of differential voltages, and are rapidly developed. The differential voltages thus developed are propagated through the plurality pairs of data bus lines DB11 and DB12 to DBn1 and DBn2 to the input and output unit 7, and are supplied through the input and output data pins IO1 to IOn to a destination.

As will be appreciated from the foregoing description, the block selecting circuit 12 responsive to the test signal TE allows a diagnostic system to concurrently write test bits into and read out the test bits from all of the memory cell blocks 11a to 11d, and the dynamic bias test is shrunk to a quarter of the time period for the prior art semiconductor memory device. If the memory cell array 11 is broken down into k memory cell blocks, the dynamic bias test is decreased to 1/k, and the throughput of the diagnostic system is improved.

Figure 5:
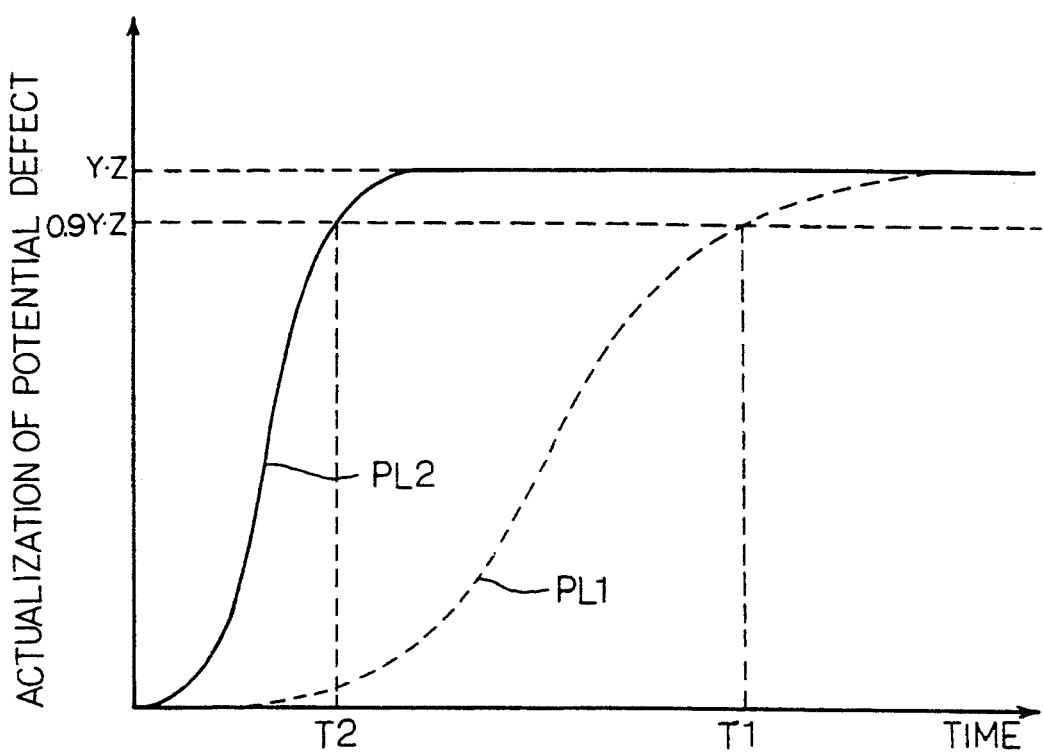
FIG. 5 is a graph showing the actualized potential defects in terms of time period for the dynamic bias test.

FIG. 5 illustrates actualization of potential defect in terms of time period for the dynamic bias test. Assuming now that y products are averaged at z potential defective bits, the actualization of potential defects traces Plots PL1 for the prior art semiconductor memory device and Plot PL2 for the semiconductor memory device according to the present invention. If the dynamic bias test targets the actualization at 90 percent, the dynamic bias test reaches the target percentage at time T1 for the prior art semiconductor memory device. However, the bias test achieves the target percentage at time T2 for the semiconductor memory device according to the present invention. If each cycle is completed within time period tb, each memory cell group of the prior art semiconductor memory device is applied with the dynamic stress $1/(k \times m \times tb)$ times where k is the number of memory cell blocks and m is the number of rows in each memory cell block. On the other hand, each memory cell group of the semiconductor memory device according to the present invention is applied with the dynamic stress $1/(m \times tb)$ times. As a result, the semiconductor memory device according to the present invention allows the diagnostic system to easily screen out potential defects, and the dynamic bias test effectively enhances the reliability.

Second Embodiment

Figure 6:
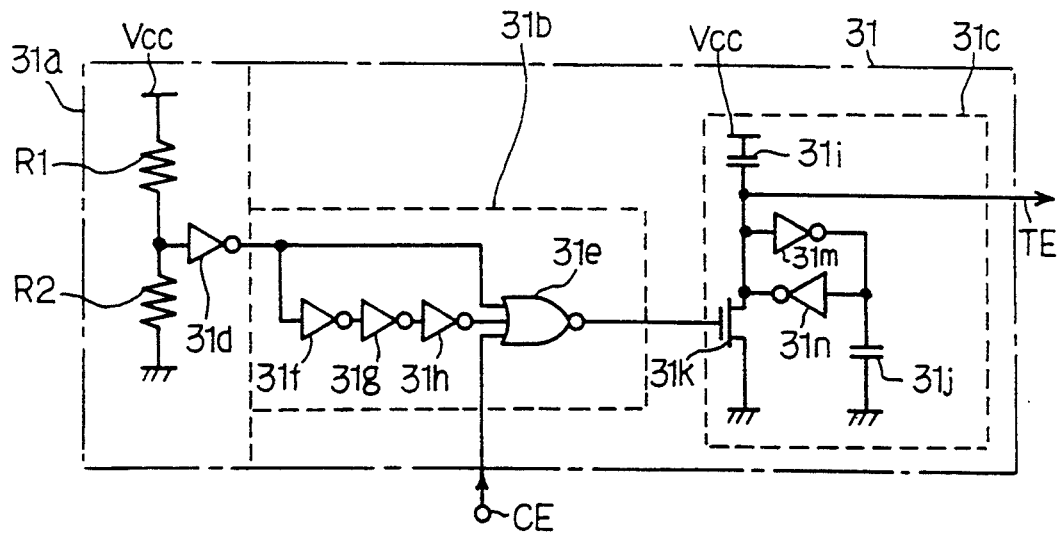
FIG. 6 is a circuit diagram showing the arrangement of a test signal generating circuit incorporated in another semiconductor memory device according to the present invention.

Turning to FIG. 6 of the drawings, a test signal generating circuit incorporated in another semiconductor memory device embodying the present invention is illustrated. The semiconductor memory device implementing the second embodiment is similar to the first embodiment except for the test signal generating circuit, and description is focused upon the test signal generating circuit.

The test signal generating circuit 31 largely comprises a monitoring circuit 31a coupled between a power supply line Vcc and a ground voltage line, a one-shot pulse generator 31b and a latch circuit 31c. The monitoring circuit is implemented by a series combination of resistors R1 and R2 associated with an inverter 31d. The ratio between the resistance of the resistor R1 and the resistance of the resistor R2 is 10:1, and the inverter 31d has a threshold of 0.7 volt. While the power supply line Vcc propagates a usual power voltage at 5.5 volts, 0.5 volt is supplied to the inverter 31d, and inverter 31d produces logic "1" level. However, if the maximum rated voltage over 7.7 volts is supplied to the power supply line Vcc, more than 0.7 volt is supplied to the inverter 31d, and the inverter 31d yield logic "0" level at time t11 of FIG. 7.

Figure 7:
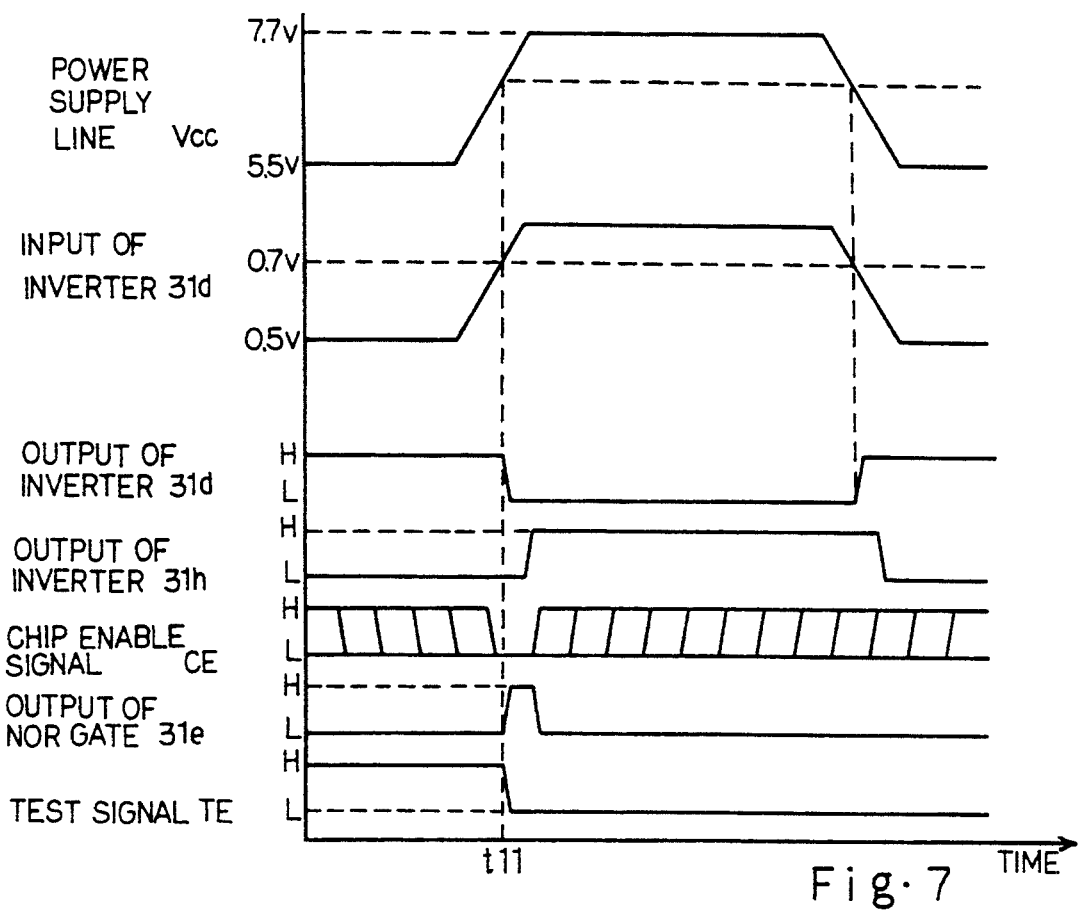
FIG. 7 is a graph showing the circuit behavior of the test signal generating circuit.

Turning back to FIG. 6, the one-shot pulse generator 31b comprises a NOR gate 31e and three inverters 31f, 31g and 31h, and a chip enable signal CE is supplied to the NOR gate 31e. In the standard modes of operation, the chip enable signal CE activates the semiconductor memory device. However, the chip enable signal is indicative of the dynamic bias test in the diagnostic mode of operation. While the inverter 31d continuously produces logic "1" level, any one-shot pulse is never generated by the one-shot pulse generator 31b. However, if the inverter 31d yields logic "0" level in the presence of the chip enable signal CE of active logic 202 level, the one-shot pulse generator 31b produces a one-shot pulse signal of logic "1" level as shown in FIG. 7.

Turning back FIG. 6 again, the latch circuit 31c comprises two capacitors 31i and 31j, an n-channel enhancement type field effect transistor 31k and two inverters 31m and 31n forming in combination a memory loop. The one-shot pulse signal of logic "1" level is positive high, and the n-channel enhancement type field effect transistor 31k turns on, and the ground voltage level is latched by the memory loop. For this reason, the test signal TE goes down to the low voltage level, and is continuously supplied to the block selecting circuit as shown in FIG. 7. However, if the semiconductor memory device is switched off and the usual power voltage is supplied, the test signal TE is recovered from the active low voltage level to the inactive high voltage level.

Any external pin is not necessary for the test signal TE, and the number of external pins is decreased by virtue of the internal test signal generating circuit 31.

Although particular embodiments of the present invention have been shown and described, it will be obvious to those skilled in the art that various changes and modifications may be made without departing from the spirit and scope of the present invention. For example, only one external pin may be assigned to the input and output data signal.

What is claimed is:

1. A semiconductor memory device selectively entering standard modes and a diagnostic mode of operation, comprising:
    a) a plurality of memory cell blocks each having a plurality of memory locations arranged in rows and columns, block addresses being assigned to said plurality of memory cell blocks, row addresses being respectively assigned to the rows of memory locations, column addresses being respectively assigned to the columns of memory locations;
    b) a block selecting unit responsive to block address bits indicative of a block address assigned to one of said plurality of memory cell blocks for producing a block selecting signal indicative of said one of said plurality of memory cell blocks in said standard modes of operation, said block selecting unit further responsive to a test signal indicative of said diagnostic mode for producing a block selecting signal indicative of said plurality of memory cell blocks regardless of said block address bits in said diagnostic mode, said block selecting unit comprising
        b-1) a block selecting circuit supplied with said block address bits and said test signal for producing decoded signals, and comprising a predecoder for producing complementary block address bits from said block address bits, a decoder responsive to said block address bits and said complementary block address bits for producing output signals, and a multiple selector operative to transfer said output signals as said decoded signals in the absence of said test signal and to shift all of said decoded signals to said active level in the presence of said test signal; and
        b-2) a plurality of block controllers respectively associated with said plurality of memory cell blocks, and responsive to said decoded signals for producing said block selecting signal;
    c) a plurality of row selecting units respectively associated with said plurality of memory cell blocks, and enabled with said block selecting signal, one of said plurality of row selecting units enabled with said block selecting signal being responsive to row address bits indicative of a row address assigned to one of said rows of memory locations in the associated memory cell block in said standard modes, all of said plurality of row selecting units being responsive to said row address bits for selecting the rows of memory locations from said associated memory cell blocks, respectively;
    d) a plurality of column selecting units respectively associated with said plurality of memory cell blocks, and each responsive to column address bits indicative of a column address assigned to one of said columns of memory locations in the associated memory cell block; and
    e) a data distributing means coupled between a data port and said plurality of column selecting means, and operative to provide a data propagation path between said data port and one of said plurality of column selecting units associated with the memory cell block indicated by said block selecting signal in said standard modes, said data distributing means being further operative to provide data propagation paths between said data port and said plurality of memory cell blocks in said diagnostic mode.

2. A semiconductor memory device selectively entering standard modes and a diagnostic mode of operation, comprising:
    a) a plurality of memory cell blocks each having a plurality of memory locations arranged in rows and columns, block addresses being assigned to said plurality of memory cell blocks, row addresses being respectively assigned to the rows of memory locations, column addresses being respectively assigned to the columns of memory locations;
    b) a block selecting unit responsive to block address bits indicative of a block address assigned to one of said plurality of memory cell blocks for producing a block selecting signal indicative of said one of said plurality of memory cell blocks in said standard modes of operation, said block selecting unit further responsive to a test signal indicative of said diagnostic mode for producing a block selecting signal indicative of said plurality of memory cell blocks regardless of said block address bits in said diagnostic mode;
    c) a plurality of row selecting units respectively associated with said plurality of memory cell blocks, and enabled with said block selecting signal, one of said plurality of row selecting units enabled with said block selecting signal being responsive to row address bits indicative of a row address assigned to one of said rows of memory locations in the associated memory cell block in said standard modes, all of said plurality of row selecting units being responsive to said row address bits for selecting the rows of memory locations from said associated memory cell blocks, respectively;

d) a plurality of column selecting units respectively associated with said plurality of memory cell blocks, and each responsive to column address bits indicative of a column address assigned to one of said columns of memory locations in the associated memory cell block;

e) a data distributing means coupled between a data port and said plurality of column selecting means, and operative to provide a data propagation path between said data port and one of said plurality of column selecting units associated with the memory cell block indicated by said block selecting signal in said standard modes, said data distributing means being further operative to provide data propagation paths between said data port and said plurality of memory cell blocks in said diagnostic mode; and f) an internal test signal generating circuit powered with a predetermined voltage level higher than a positive power voltage used in said standard modes, and responsive to an external control signal indicative of different instructions between said standard modes and said diagnostic mode for producing said test signal in said diagnostic mode, said internal test signal generating circuit comprising f-1) a monitoring circuit operative to discriminate said predetermined voltage level for producing an activation signal, f-2) a one-shot pulse generator enabled with said activation signal for producing a pulse signal, and f-3) a latch circuit powered with said predetermined voltage level, and operative to latch said pulse signal for producing said test signal.

3. A semiconductor memory device as set forth in claim 2, in which said predetermined voltage level is the maximum rated voltage of said semiconductor memory device.

* * * * *